US011217963B1

(12) United States Patent
Askari et al.

(10) Patent No.: US 11,217,963 B1
(45) Date of Patent: Jan. 4, 2022

(54) WAFER LEVEL COATINGS FOR PHOTONIC DIE

(71) Applicant: Skorpios Technologies, Inc., Albuquerque, NM (US)

(72) Inventors: Murtaza Askari, Albuquerque, NM (US); Stephen B. Krasulick, Albuquerque, NM (US)

(73) Assignee: Skorpios Technologies, Inc., Albuquerque, NM (US)

(*) Notice: Subject to any disclaimer, the term of this patent is extended or adjusted under 35 U.S.C. 154(b) by 0 days.

(21) Appl. No.: 16/698,853

(22) Filed: Nov. 27, 2019

Related U.S. Application Data

(60) Provisional application No. 62/771,979, filed on Nov. 27, 2018.

(51) Int. Cl.
  *H01S 5/028* (2006.01)
  *G02B 6/42* (2006.01)
  *H01S 5/02* (2006.01)
  *H01S 5/40* (2006.01)

(52) U.S. Cl.
  CPC .......... *H01S 5/0287* (2013.01); *G02B 6/4212* (2013.01); *H01S 5/0281* (2013.01); *G02B 6/423* (2013.01); *H01S 5/021* (2013.01); *H01S 5/4012* (2013.01)

(58) Field of Classification Search
  None
  See application file for complete search history.

(56) References Cited

U.S. PATENT DOCUMENTS

| | | | |
|---|---|---|---|
| 8,634,442 B1* | 1/2014 | Raring | H01S 5/0202 372/44.01 |
| 9,316,785 B2* | 4/2016 | Krasulick | G02B 6/1225 |
| 2003/0169981 A1* | 9/2003 | Nakanishi | G02B 6/42 385/92 |
| 2012/0177075 A1* | 7/2012 | Koeth | H01S 5/028 372/44.01 |
| 2014/0153600 A1* | 6/2014 | Luo | B82Y 20/00 372/40 |
| 2015/0244147 A1* | 8/2015 | Stojetz | H01S 5/32341 372/49.01 |
| 2018/0083417 A1* | 3/2018 | Pezeshki | G02B 6/12019 |

* cited by examiner

*Primary Examiner* — Jerry Rahll
(74) *Attorney, Agent, or Firm* — Kilpatrick Townsend & Stockton LLP

(57) ABSTRACT

A photonic die includes an optical component that can emit output light. The optical component includes a substrate having a length and width that are substantially greater than a thickness thereof, the thickness defining a vertical direction. The optical component includes a vertical edge, and a reflective or antireflective coating on the vertical edge, wherein the reflective or antireflective coating includes a silicon-based material.

12 Claims, 4 Drawing Sheets ated Apr. 19, 2016, from U.S.
WAFER LEVEL COATINGS FOR PHOTONIC DIE

CROSS-REFERENCE TO RELATED APPLICATIONS

This application claims priority to U.S. Provisional Patent Application No. 62/771,979, filed on Nov. 27, 2018, entitled "Wafer Level Coatings for Photonic Die," the disclosure of which is hereby incorporated by reference in its entirety for all purposes.

U.S. Pat. No. 9,316,785, issued Apr. 19, 2016, from U.S. patent application Ser. No. 14/509,914, filed on Oct. 8, 2014, and entitled "Integration of an Unprocessed, Direct-Bandgap Chip Into a Silicon Photonic Device" is incorporated by reference in its entirety for all purposes.

BACKGROUND

A semiconductor laser typically surrounds a gain medium, such as a direct bandgap, compound semiconductor material, with at least partially reflective mirrors to create a resonant cavity. As the gain medium emits light, the light is constrained by the resonant cavity to be coherent, that is, in-phase and within a specific, very narrow spectral range. One mirror of the cavity (sometimes called the "back mirror") is usually highly reflective; such mirrors may be formed, for example, of metal reflectors or other highly reflective coatings. Another mirror of the cavity (sometimes called the "front mirror" or "output mirror") is partially transmissive to let some of the emitted light escape the cavity as output light. Partially transmissive mirrors called distributed Bragg reflectors (DBRs) can be made by creating regions of materials having different refractive indices, transverse to a light path. Each change in refractive index generates a Fresnel reflection related to the difference between refractive indices. Although each Fresnel reflection is typically only a very small percentage of the incident light, providing enough of these partially reflective material interfaces can generate a highly reflective layer stack. Also, within each region of each material an opportunity exists for constructive or destructive interference between light propagating in forward and reverse directions along the light path, so length of each material along the light path is important. Thus, net reflection and transmission in the light path can be adjusted by providing material changes in the light path with a known number and magnitude of refractive index changes, and length of each material in the light path. Mirrors made in this manner can be optimized for either front or back mirror use.

A semiconductor laser may be formed and used as a stand-alone component, and may be considered a photonic die on its own. Alternatively, a semiconductor laser may be used and formed as part of a more complex photonic die, as a useful and controllable light source for applications including, but not limited to, high speed data transfer, telecommunications, and optical instrumentation. In the more complex photonic die, light generated by one or more lasers may be guided (e.g., with waveguides) into other optical and/or electronic components where the light may be modified. As-emitted light, or optionally modified light, is generally transmitted out of a photonic die at some point, and into media such as air, fiber optics or other optical devices.

Lasers can be very sensitive to any outside reflection of light going back into the resonant cavity. The location where output light exits a photonic die can generate reflections that can propagate backwards into the laser, presenting a hazard to the laser. Reflections that re-enter the laser's resonant cavity can result in undesirable effects such as amplitude noise, linewidth broadening, or multi-cavity-mode lasing. Because of these effects, photonic die (including stand-alone semiconductor lasers) may be provided with an antireflection coating where light leaves the photonic die, to help defeat output reflections.

SUMMARY

Systems and methods herein recognize the advantages of improved methods and materials for addition to edges of photonic die, including edge-emitting semiconductor lasers. The materials described herein may be used as portions of reflective coatings including highly reflective coatings, antireflective coatings, and/or for other purposes. The, methods, techniques and materials described herein are made desirably easily, repeatably, and inexpensively.

In one or more embodiments, a method of depositing a coating on vertical surfaces of a photonic die includes characterizing a relationship of horizontal coating thickness to vertical coating thickness for the photonic die, for a wafer fabrication tool that will deposit the coating; using the wafer fabrication tool to deposit the coating on the vertical surface of the photonic die; and measuring a horizontal coating thickness that is deposited simultaneously with the coating on the vertical surface of the photonic die, to provide process feedback for the vertical coating thickness.

In one or more embodiments, a photonic die includes an optical component that is capable of emitting output light. The optical component includes a substrate having a length and width that are substantially greater than a thickness thereof, the thickness defining a vertical direction. The optical component includes a vertical edge, and a reflective or antireflective coating on the vertical edge, wherein the reflective or antireflective coating comprises a silicon-based material.

Further areas of applicability of the present disclosure will become apparent from the detailed description provided hereinafter. It should be understood that the detailed description and specific examples, while indicating various embodiments, are intended for purposes of illustration only and are not intended to limit the scope of the disclosure.

BRIEF DESCRIPTION OF THE DRAWINGS

Embodiments are described in detail below with reference to the following figures, in which like numerals within the drawings and mentioned herein represent substantially identical structural elements.

DETAILED DESCRIPTION

Figure 1A:
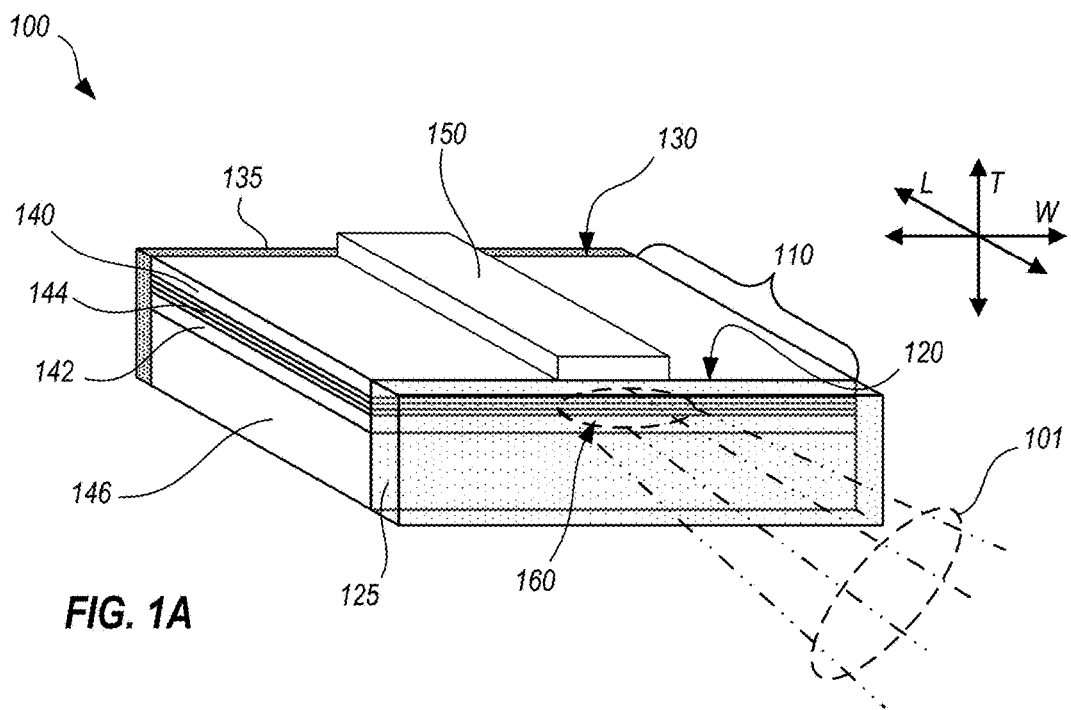
FIG. 1A schematically illustrates a semiconductor laser that forms a resonant cavity between a front mirror on a front facet, and a back mirror on a back facet, according to one or more embodiments.

The subject matter of certain embodiments are described here with specificity to meet statutory requirements, but this description is not intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Each example is provided by way of illustration and/or explanation, and not as a limitation. For instance, features illustrated or described as part of one embodiment may be used on another embodiment to yield a further embodiment. Upon reading and comprehending the present disclosure, one of ordinary skill in the art will readily conceive many equivalents, extensions, and alternatives to the specific, disclosed apparatus and structures, all of which are within the scope of embodiments herein.

One form of DBR arranges refractive index changes by applying successive material layers that are transverse to the light path. The material layers can be applied by various means such as applying alternating layers of materials (e.g., when the expected light propagation direction is transverse to the layers) or by etching properly spaced recesses in a layer of a first material, and depositing a second material into the recesses (e.g., when the expected light propagation direction is transverse to the recesses). For example, vertical cavity surface-emitting lasers (VCSELs) typically use this approach by growing alternating layers of materials using metallorganic chemical vapor deposition (MOCVD) or molecular beam epitaxy (MBE).

The reflection spectrum of such multi-layer stack DBRs can be very sensitive to small changes in refractive index and/or coating thicknesses within the stack. This sensitivity creates challenges for "edge-emitting" lasers that are formed using die-edge multi-layer mirrors. Because of the need for tight thickness control, an edge of an edge-emitter semiconductor die where the mirror is being formed may be first carefully singulated out of a piece of semiconductor, then formed and/or polished to produce a very flat surface. Thus, subsequently formed regions adjacent to the polished surface will be planar and squarely transverse to the intended light path within the die. Then, the edge-emitter die is placed within a fixture that presents the edge face as a horizontal surface to processing equipment.

As noted below, sputtering or evaporation equipment is typically used to provide DBR coatings, and since sputtering and evaporation tend to provide "line of sight" depositions (e.g., sputtered or evaporated materials tend to travel in a straight line and stick to the first surface that they encounter) the orientation of the edge face to the material source is important.

Certain embodiments herein are based on an appreciation that highly reflective and/or antireflective coatings for photonic die, including semiconductor lasers and/or photodetectors, may be provided by materials that are not typically used in semiconductor manufacturing, such as $TiO_2$, $Ta_2O_5$, and/or $Al_2O_3$. These materials can be deposited by evaporation or sputtering. However, processing equipment that for these depositions is somewhat specialized and may not be found in fabrication areas ("fabs") that primarily handle silicon-based manufacturing.

Certain embodiments are based on an appreciation of a novel way to deposit coatings on edges of photonic die. In particular, although deposition and metrology are usually optimized for horizontal surfaces, as discussed elsewhere herein, techniques have been developed for performing and controlling deposition thicknesses on vertical surfaces.

In a first example, FIG. 1A schematically illustrates an edge-emitting semiconductor laser 100 that forms a resonant cavity 110 between a front mirror 125 on a front facet 120, and a back mirror 135 on a back facet 130. Semiconductor laser 100 shown is typically fabricated by depositing and/or growing cladding layers 140 and 142, quantum wells 144 and others, as shown in FIG. 1A, on a compound semiconductor substrate 146. A ridge waveguide may be formed from the same material as top cladding 140 and/or additional material(s) deposited thereon, to guide light into a desired propagation direction within laser 100. Ridge waveguide 150 may also provide electrical connectivity to one side of a p-n diode formed by laser 100, and substrate 146 may supply electrical connectivity to the other side of the p-n diode. Then, substrate 146 would be singulated into individual chips. Typically, front and back facets 120 and 130 would be polished and processed to provide front and back mirrors needed. However, in some embodiments described below, emission through back facet 130 is not needed, so back mirror 135 can be formed either from metal or by a highly reflective multi-layer structure (e.g., enough refractive index changes of sufficient magnitude to make the back mirror 95%-99.99% reflective). Since emission is desired from front facet 120, an opaque metal mirror is not suitable as front mirror 125. In this example front mirror 125 may be formed by a partially reflective DBR structure (e.g., perhaps 90%-95% reflective) so that some light 101 is emitted as output light from an emission area 160. Providing the partially reflective DBR structure is an application for high reflectivity coatings, as described below.

It is helpful to note that in connection with devices grown, etched or otherwise fabricated on a substrate herein, terms such as "top," "bottom," "above," "below," "vertical," "horizontal" and the like are sometimes used to aid in understanding features shown in the drawings and the appended claims. To provide an appropriate frame of reference for these terms, FIG. 1A and other drawings herein include axes labeled L, T and/or W. Direction T (thickness) is considered a "vertical" direction, while directions L (length) and W (width) are both considered "horizontal" directions. These meanings are adhered to, notwithstanding that, for example, elements described below could be turned in various directions during fabrication and/or subsequent use. It can be seen that, generally speaking, a substrate (e.g., a wafer, or a singulated portion of a wafer) on which a device is fabricated will have a length and a width that are substantially greater than a thickness of the device and especially individual features thereof.

Figure 1B:
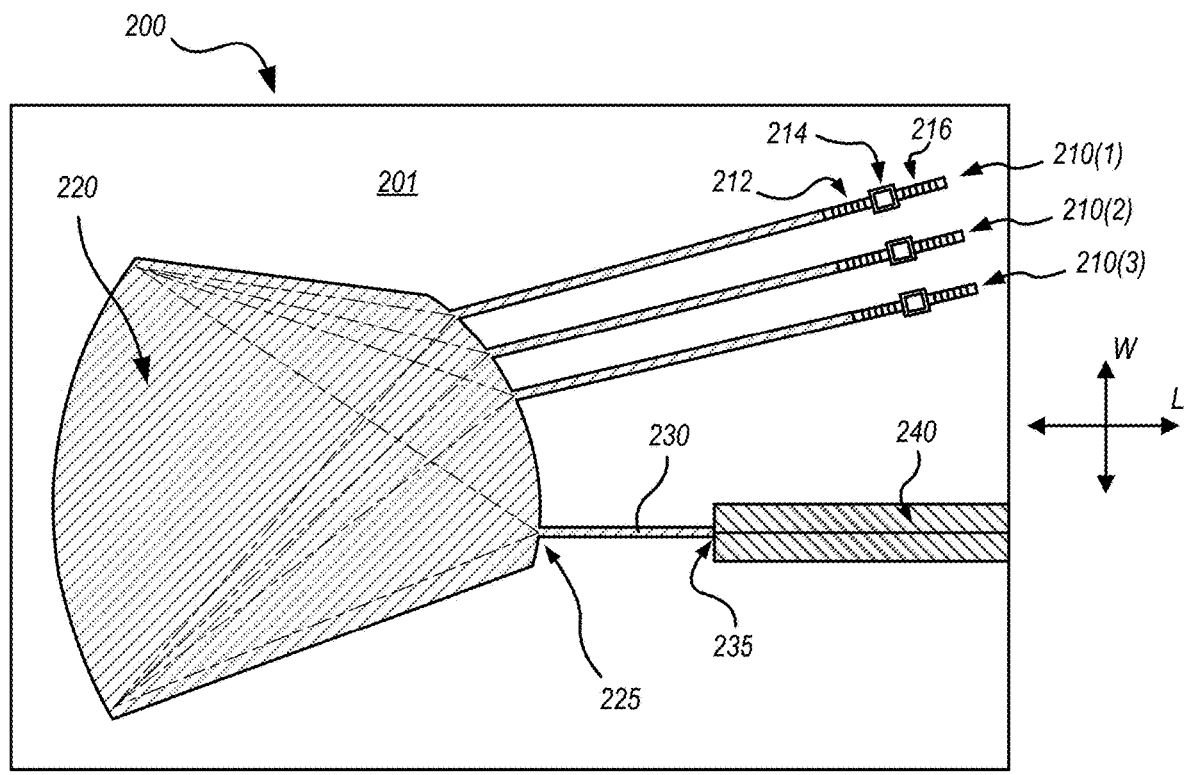
FIG. 1B is a schematic plan view of a photonic die that combines output of several input lasers with an echelle grating into a waveguide, according to one or more embodiments.

In a second example, FIG. 1B schematically illustrates, in a plan view, a photonic die 200 that combines output of several input lasers 210(1) 210(2), 210(3), with an echelle grating 220, into a waveguide 230. Because FIG. 1B is a plan view, axis T is not shown (the T direction is in and out of the plane of FIG. 1B). Input lasers 210(1) 210(2), 210(3), echelle grating 220 and waveguide 230 may be integrated with, and/or fabricated from one or more parts of, a silicon-based platform 201 which may be, for example, a silicon or silicon-on-insulator substrate. While not required, use of a silicon-based platform 201 may be advantageous due to, for example, much lower cost than compound semiconductor substrates, and the existence of many wafer fabrication tools and techniques common to silicon-based (e.g., CMOS) semiconductor manufacturing. Input lasers 210(1) 210(2) and 210(3) each include a respective gain chip 214 in optical communication with DBRs 212 and 216, as illustrated. Each pair of DBRs 212 and 216 form an optical cavity about gain chip 214 (only one set of such devices is labeled, for clarity of illustration). Each of lasers 210(1) 210(2) and 210(3) provides output at a slightly different wavelength. Echelle grating 220 forms a single output port 225 that passes output light into a waveguide 230, which ends at an output facet 235. Photonic die 200 forms a V-groove 240 adjacent to output facet 235, so that an optical fiber (not shown) can align to the output facet and take the output light to other components or an instrument output. Echelle grating 220 is capable of diffracting light of different wavelengths through different angles, so although input lasers 210(1) 210(2) and 210(3) are of different wavelengths, their output can be combined into output port 225 and output waveguide 230. However, if output facet 235 generates reflections, portions of the output light could reflect back through output waveguide 230 and echelle grating 220, and be diffracted back to their originating lasers 210(1) 210(2), 210(3).

Providing an antireflective coating for the output facet 235 is thus desirable, and an application for antireflective coatings, as described below. This is but one instance showing that in general, it is desirable to provide antireflective coatings on transmitting devices of various types, to protect source lasers from reflections. It is also desirable to provide antireflective coatings for photodetectors, for example the detectors that receive incoming light in an optical communication system and generate an electronic signal from the light. The antireflective coating enhances performance by increasing the net light delivered to the detector, thus increasing the strength of the electronic signal generated.

It can be seen that the semiconductor laser in FIG. 1A and the photonic die in FIG. 1B are both essentially edge-emitting devices. That is, the edges on which reflective and/or antireflective performance is needed, are generally formed as vertical edges with respect to a horizontal substrate surface (e.g., a wafer on which the structures shown are provided by typical semiconductor type processing). A significant reason that typical wafer fabrication techniques and materials may not be used for highly reflective and/or antireflective coatings on edge-emitting devices, is that coating thicknesses on vertical facets are not readily determined by normal fabrication metrology. For example, a wide variety of tools use ellipsometry and/or reflectometry to measure coating thicknesses on horizontal wafer surfaces that are easy to access optically. A test wafer on which a coating is deposited can generally be placed upon a wafer stage, act as a mirror, and span a large area (e.g., millimeters) for access by the metrology tool. However, such tools are not configured to measure coating thicknesses on vertical edges that may be on the order of only microns deep and are immediately adjacent to other features generating reflections. Additionally, the planar nature of semiconductor devices has typically favored the development of deposition tools that deposit very uniform coatings on horizontal wafer surfaces, but such coatings may or may not be of the same thickness as the coating deposited at the same time, on a vertical surface. Thus, in practice, the devices illustrated in FIGS. 1A and 1B are typically fabricated in wafer form except for the vertical edge coatings, then singulated and turned edgewise, that is, with the vertical edges turned upwards to form horizontal surfaces, to add the coatings.

Figure 2:
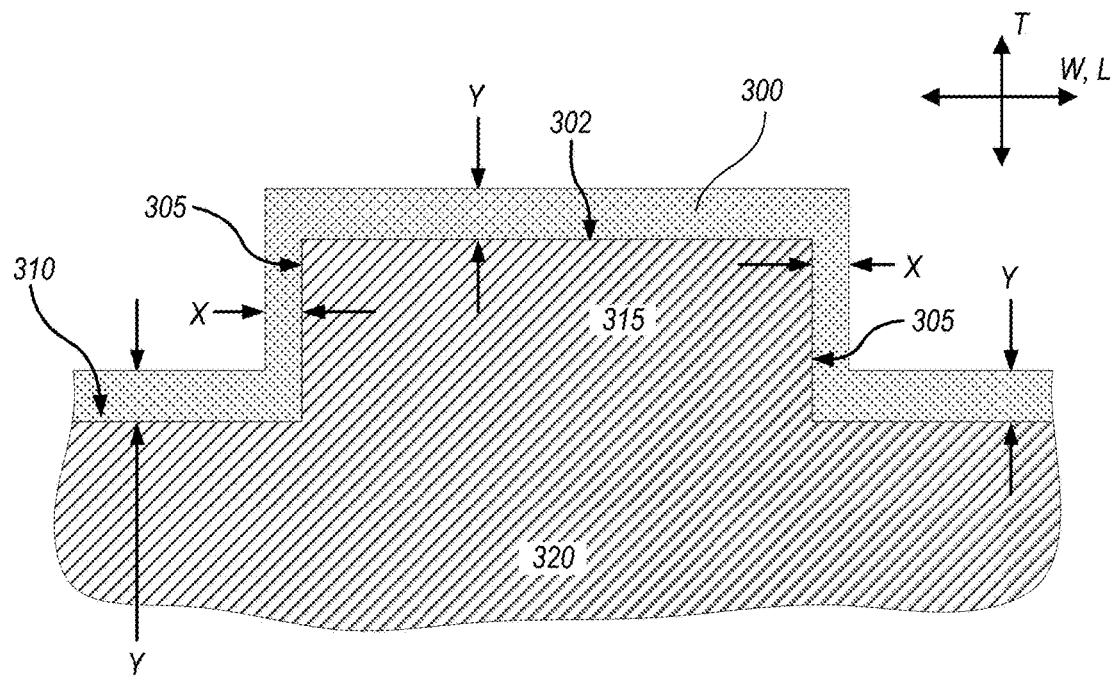
FIG. 2 schematically illustrates a material deposited on a feature that extends vertically from a wafer surface, according to one or more embodiments.

FIG. 2 schematically illustrates, in a partial cross-sectional view, a coating 300 deposited on a feature 315 that extends vertically from a surface 310 of a substrate 320, to an upper surface 302, thus forming vertical edges 305. In FIG. 2, the T direction is vertical, and the horizontal direction could be considered either of directions W or L. It should be appreciated from the discussion of FIGS. 1A and 1B that material thicknesses on an as-fabricated, vertical light-emitting edge will determine the reflective and/or antireflective effects they provide if the feature shown is an edge-emitting optical device.

As discussed above, when coatings are deposited to a given thickness on a horizontal surface (e.g., thickness Y above surfaces 302 or 310 in FIG. 2), a corresponding thickness along an adjacent vertical surface (e.g., thickness X adjacent to vertical edge 305) can vary from Y. Not only can X vary from Y, but the feature and coating geometries illustrated in FIG. 2 correspond to an idealized case wherein the coating thickness on the vertical edge is constant, and does not vary, but this is not always the case. Typical factors that influence X include but are not limited to the type of coating 300 being deposited, the deposition technique, distance of the location where X is measured from the upper and lower corners of the feature 315, slope of the feature 315 relative to the substrate where X is measured, proximity of the vertical feature 315 to other such features, the type of substrate 320, and/or whether substrate 320 is in direct contact with the processing equipment, or in a carrier type arrangement (e.g., see FIGS. 4 and 5 below), in addition to the factors that influence Y.

FIG. 2 can be considered to illustrate an example of an optical component of a photonic die, where the optical component is capable of emitting and/or receiving light. The component has a length and width (dimensions W, L) that are substantially greater than a thickness thereof (dimension T). The thickness (dimension T) defines a vertical direction, in terms of providing a frame of reference for "vertical" herein.

Figure 3:
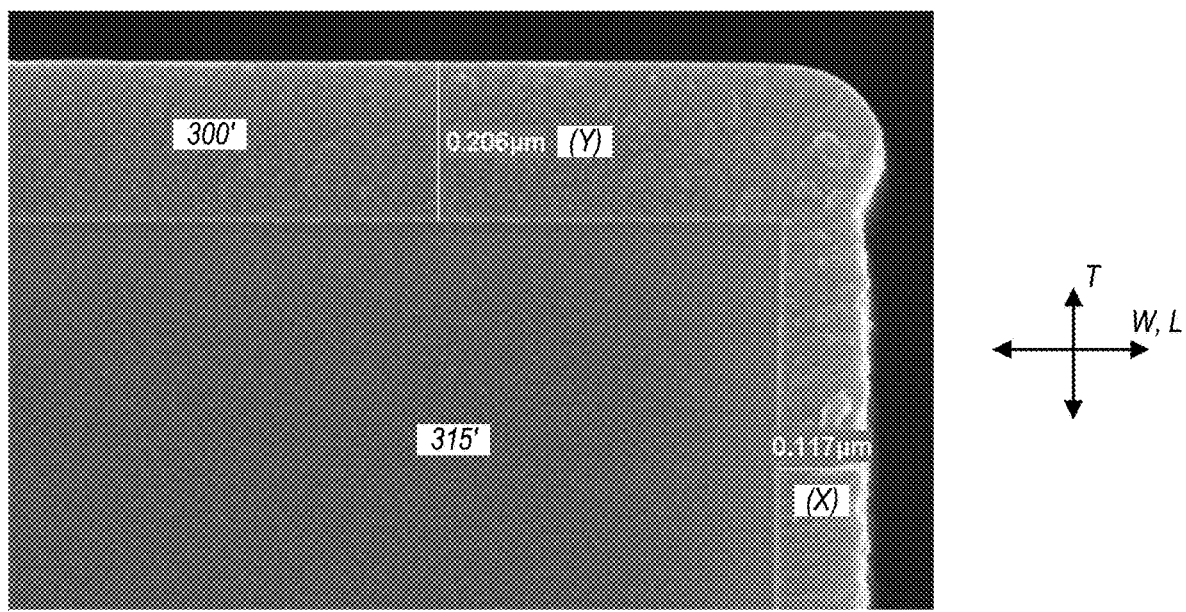
FIG. 3 is a scanning electron microscope (SEM) photograph of a feature with a film deposited thereon, according to one or more embodiments.

FIG. 3 is a scanning electron microscope (SEM) photograph that provides a partial cross-sectional view of a feature 315' with a coating 300' deposited thereon, that illustrates some of the factors noted above. Again, in FIG. 3, the T direction is vertical, and the horizontal direction could be considered either of directions W or L. An upper corner of a feature etched with a vertical sidewall, then coated with a coating, is shown. The coating can be seen to be uniform over the flat top surface of the feature, with a coating thickness Y of 0.206 µm measured at one location. However, the thickness X along the vertical edge is less uniform, and has a "breadloaf" shape where X first decreases, then increases as coating 300' approaches the upper corner of the feature. At one location, the coating thickness X along the vertical edge is measured at 0.117 µm.

Despite the challenges noted above, the present inventors have found that in most circumstances, and subject to constraints such as measuring at a particular level, a relationship of X to Y is repeatable enough that a coating deposited on a vertical edge can be suitably controlled to enable useful processing of highly reflective and/or antireflective coatings on vertical edges, and enable use of standard silicon-based materials. The relationship between X and Y may be a ratio or may be some other function wherein knowledge of Y can be used to predict X reliably. Techniques for enabling the use of such coatings and materials include characterizing X and Y for a given material and deposition technique, ensuring that a location where coating thickness is critical is located at a suitable height along the vertical edge, ensuring that proximity and slope effects are controlled or at least known, and using measurements of Y to provide process feedback as needed. Optionally, characterization of X and Y may also include tracking slope of a particular etched geometry, horizontal separation of a vertical edge from adjacent features, a particular height or depth at which X is measured, from the substrate surface or feature top respectively, and/or how the material being processed is presented to the processing equipment (e.g., type of substrate, and/or whether the material is a wafer, a die within a carrier, or some other arrangement). Not all of these techniques are always employed in each instance.

Generating vertical edges that reflective or antireflective coatings are to be deposited on can involve singulating a wafer or other substrate to form individual chips (e.g., as in FIG. 1A) or photonic die (as in FIG. 1B). This can create a processing challenge in that most semiconductor processing equipment is set up for processing whole wafers, not singulated chips. In further embodiments, this challenge is addressed by creating "pocket" wafers that are adapted to carry singulated photonic die in and out of processing equipment, and present the photonic die suitably for processing of the vertical edges.

Figure 4:
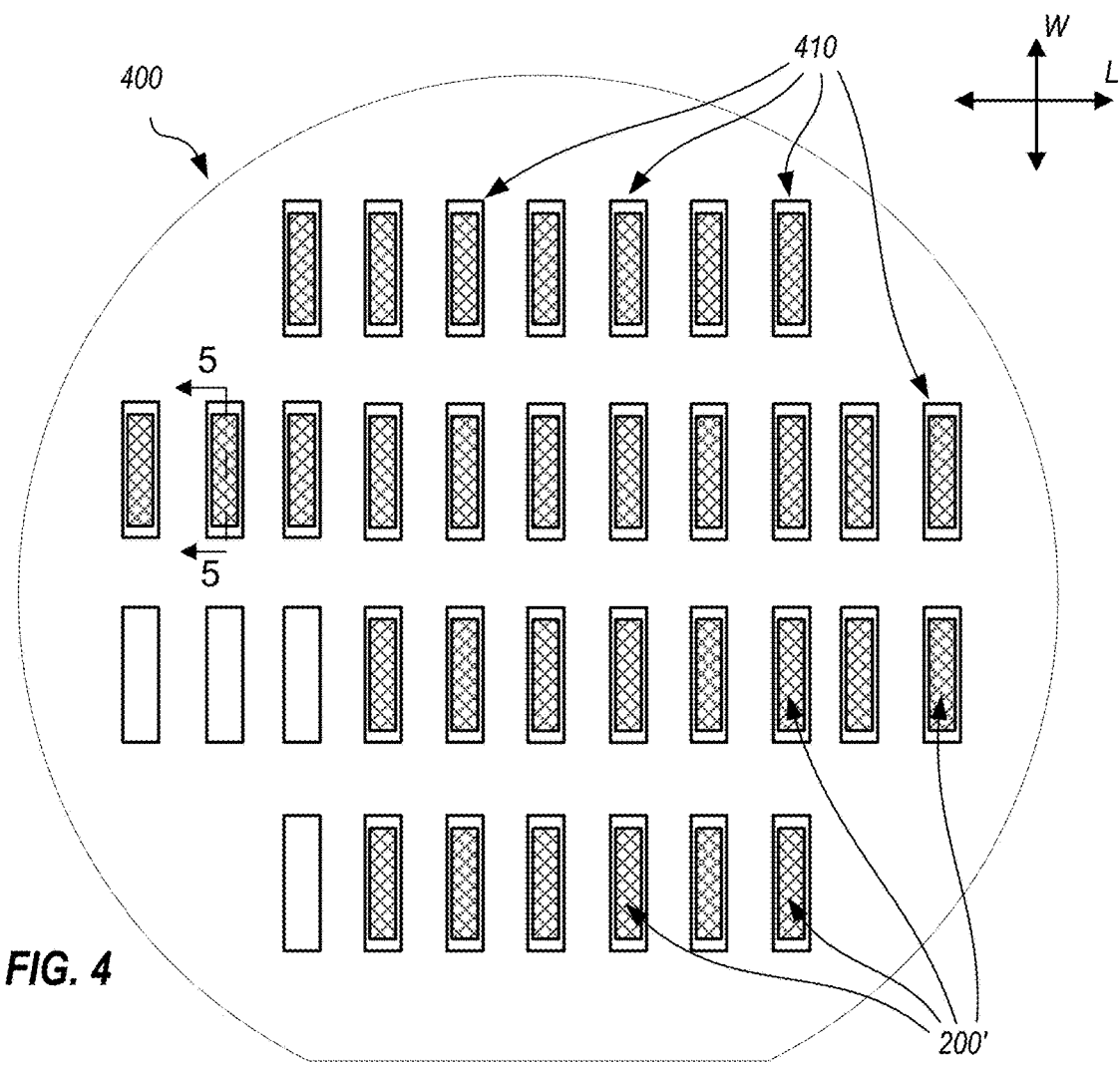
FIG. 4 illustrates an example of a pocket wafer with photonic die in the pockets provided, according to one or more embodiments.
Figure 5:
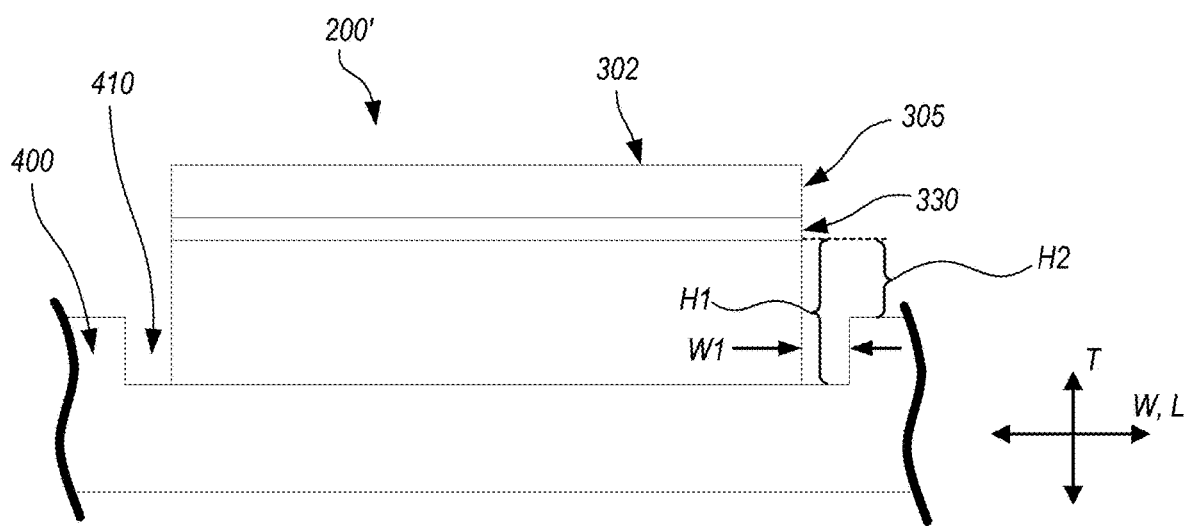
FIG. 5 illustrates a single photonic die in one pocket, in a cross-sectional plane indicated by a sight line through one pocket in the pocket wafer of FIG. 4, according to one or more embodiments.

FIG. 4 illustrates an example of a pocket wafer 400 with photonic die 200' in many pockets 410 formed in wafer 400. Because FIG. 4 is a plan view, axis T is not shown (the T direction is in and out of the plane of FIG. 4). Pockets 410 are advantageously slightly larger in length and width than photonic die 200', so that photonic die 200' can easily fit into pockets 410, yet pockets 410 remain small enough to provide a large number of such pockets per wafer. FIG. 5 schematically illustrates, in a partial cross-sectional view, a single photonic die 200' in one such pocket 410, in a cross-sectional plane indicated by a sight line 5-5 in FIG. 4 through one pocket 410 in pocket wafer 400. In FIG. 5, the T direction is vertical, and the horizontal direction could be considered either of directions W or L. Pocket wafer 400 as illustrated in FIGS. 4 and 5 can easily be created by a single photolithography and etch step, with a pattern that need not be aligned to any other patterns. When photonic die 200' are ready for transfer into the pockets shown, they may be transferred with standard pick and place equipment (not all pockets 410 need have a photonic die 200 within them, as shown in FIG. 5). Each photonic die 200' presents an upward facing, horizontal surface 302, and vertical edges 305, as shown. Then, the entire pocket wafer 400 and all present photonic die 200' are processed normally to deposit the required layer(s) on the upward-facing horizontal surfaces 302, and all vertical edges 305, of the photonic die 200'. After the layer(s) are deposited, if needed, an anisotropic etch step can be used to remove the layer(s) from horizontal upper surfaces 302 without significantly affecting the coating on the vertical surfaces 305. For example, it may be desirable to remove the coating from horizontal surfaces 302 to allow electrical access to probe pads on horizontal upper surface 302.

The use of pocket wafer 400 as shown in FIGS. 4 and 5 addresses many of the fabrication challenges faced when coating a vertical face of a die. For example, if a deposition process is characterized so as to determine a horizontal spacing at which coatings of adjacent die begin to be affected by proximity of an adjacent die, the pockets can be provided at a distance from one another that is greater than such spacing. Also, as shown in FIG. 5, a depth H1 of each pocket 410 can provide a clearance H2 for a critical feature 330 on vertical edge 305 to be coated (e.g., a location where reflection and/or emission occur) over the pocket wafer surface, so that thickness of a coating over the critical feature can be unaffected by vertical proximity of the pocket wafer surface. This also reduces variations in a width W1 of vertical edge 305 from edges of pocket 410, due to location of photonic die 200' within pocket 410. Yet, the depth of pocket 410 itself can be great enough that when photonic die 200' are simply placed in pockets 410, pocket wafer 400 can be loaded into wafer processing equipment (e.g., with standard wafer handling accessories) without photonic die 200' shaking out of pockets 410. In some embodiments, photonic die 200' can be stabilized within pockets 410 with adhesives, reflowed solder type materials or the like. Of course, some of these techniques may affect the value of thickness X on vertical edges relative to thickness Y on horizontal surfaces. It may be necessary to control or otherwise account for such influences in order to accurately predict what thickness X will result from a measured thickness Y for a given coating.

In addition to providing coatings on vertical edges, certain embodiments herein utilize standard silicon-based materials, and other materials, to form highly reflective and/or antireflective layers. This provides additional leverage to the strategy of utilizing standard wafer fabrication tools and materials. For example, instead of using $TiO_2$, $Ta_2O_5$, and/or $Al_2O_3$ as discussed above, reflective and/or antireflective layers can be formed with materials such as Si, $SiO_2$, $Si_3N_4$, $SiN_X$, $SiO_XN_Y$, SiC, SiCO and others which can be deposited with good control of thickness and composition by such deposition techniques as CVD and PECVD in common use in semiconductor fabrication and processing factories. Refractive indices of some of these materials (at wavelengths of interest, e.g., greater than about 650 nm) are listed in Table 1 below.

TABLE 1

Typical silicon-based and other materials used in semiconductor manufacturing

| Material | Refractive Index | Material | Refractive Index |
| --- | --- | --- | --- |
| $SiO_2$ | 1.45 | SiC | 1.9 |
| $SiN_X$ | 2.1-3.5 | SiCO | 1.78 |
| $SiO_XN_Y$ | 1.44-2.1 | Si | 3.5 |
| Ge | 4.0 | $Si_{1-X}Ge_X$ | 3.5-4.0 |
| DLC (Diamond-like Carbon) | 2.0 | GaN | 2.43 |
| Carbon Nanotubes | 1.0-2.7 | Graphene | 3.14 |

Use of the materials above can be particularly advantageous in that refractive indices of $SiN_X$, $SiO_XN_Y$, and certain other materials can be tuned within the ranges noted in Table 1 to provide desirable values for reflective and/or antireflective coatings. In some embodiments, multi-layer antireflective coatings can be replaced by a single layer antireflective coating that has a refractive index at a specific value relative to a refractive index of an emission feature. For example, a Si waveguide having n=3.5 is desirably coated with an antireflective layer having n=1.871, or at least within the range n=1.85 to 1.90, which is within the tuning range of $SiO_XN_Y$. Also, because Fresnel reflections vary according to the difference between refractive indices at an interface, it is advantageous to be able to use materials with large refractive index differences, such as those noted above. Thus, in some embodiments, the number of layers required to achieve a specific reflectivity is considerably less when indices in such a large range become available with present invention, as compared to previously used materials. These techniques for large and easy tuning of refractive index in deposited coatings greatly enhance manufacturability, as compared with prior art materials and/or deposition techniques. For example, with $TiO_2$, $Ta_2O_5$, and/or $Al_2O_3$ as discussed above, it is almost impossible to controllably tune refractive index of the deposited coating. The flexibility provided by refractive index tuning greatly eases design of highly reflective and/or antireflective coatings.

Also, tools that employ techniques such as chemical vapor deposition (CVD) or plasma-enhanced chemical vapor deposition (PECVD) for depositing these materials have been extensively developed to provide good coating thickness uniformity, as required for reflective and/or antireflective coatings. Both across-wafer and wafer-to-wafer variations in refractive index are typically controlled within 0.5%, and similar thickness variations are typically controlled within 2%. Furthermore, these Si-based materials exhibit good adhesion, mechanical hardness, resistance to diffusion of unwanted substances, resistance to corrosion and corrosive chemicals, high dielectric strength, and low optical absorption in wavelengths of interest.

Figure 6:
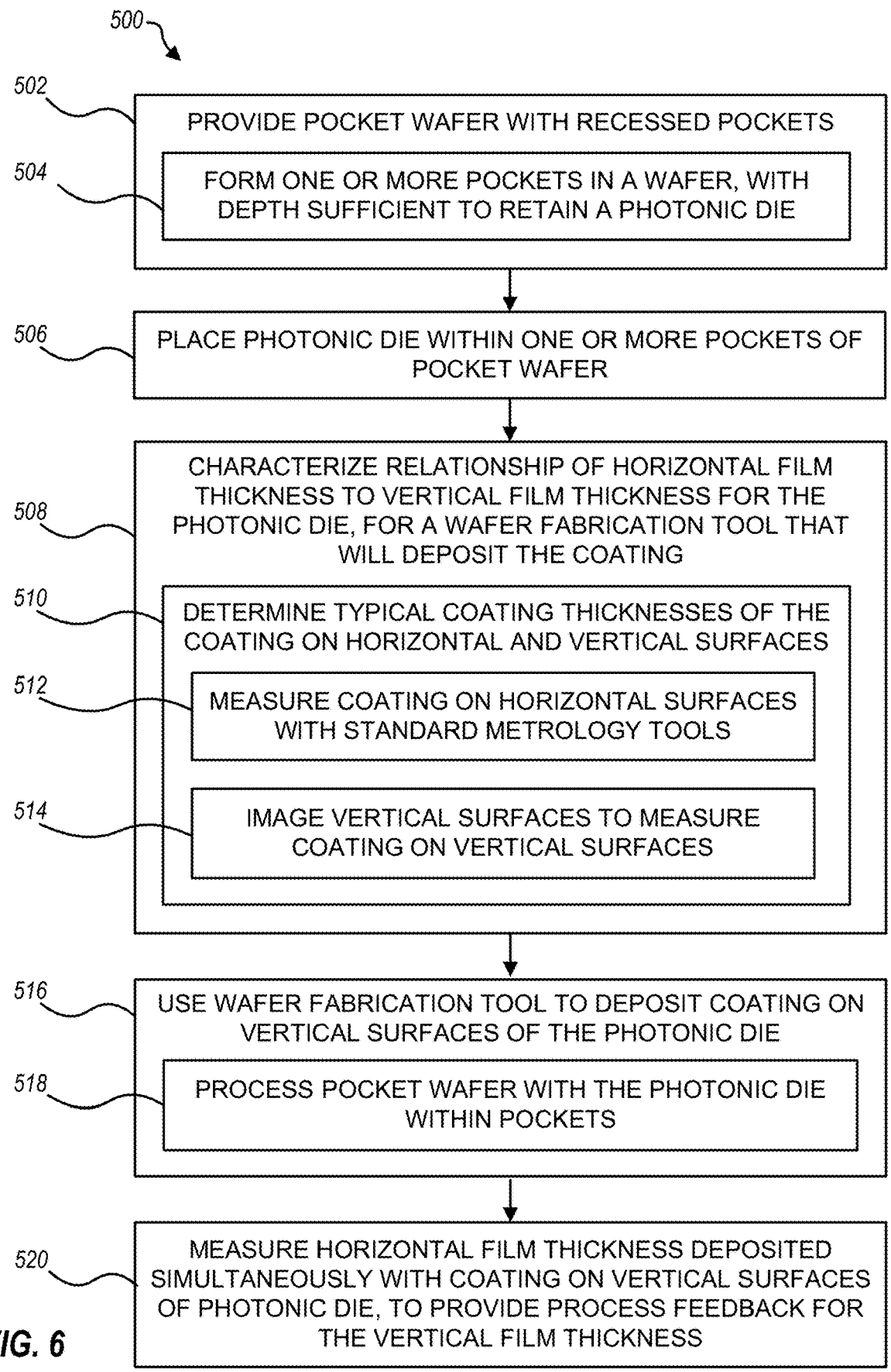
FIG. 6 is a flowchart of a method 500 for depositing a coating on a vertical surface of a photonic die, according to one or more embodiments.

FIG. 6 is a flowchart of a method 500 for depositing a coating on a vertical surface of a photonic die. Step 508 will sometimes be a first step of method 500, but step 508 may be preceded by optional steps 502, 504 and 506 as discussed below. Step 508 characterizes a relationship of horizontal coating thickness to vertical coating thickness for the photonic die, for a wafer fabrication tool that will deposit the coating. An example of step 508 is characterizing a relationship between horizontal coating thickness Y to vertical coating thickness X, as illustrated in FIGS. 2 and 3. A common, but optional, way to perform step 508 is to perform optional step 510, which determines typical coating thicknesses of the coating on horizontal and vertical surfaces. A further common, but optional, way to perform step 510 is to perform optional steps 512 and 514. Step 512 measures an example of the desired coating on a horizontal surface, using standard metrology tools. An example of step 512 is measuring coating thickness Y of coating 300, schematically shown in FIG. 2, or of coating 300' shown in FIG. 3. Step 512 may be performed on an actual photonic die or on another surface that is exposed to the same coating deposition. Step 514 images an example of the desired coating on a vertical surface, in order to measure its thickness. An example of step 514 is imaging coating 300', as shown in FIG. 3, to determine coating thickness X. Step 514 may be performed on an actual photonic die or on another feature that is exposed to the same coating deposition.

Once the relationship of horizontal coating thickness to vertical coating thickness for the photonic die (e.g., Y to X as discussed above) for the wafer fabrication tool that will deposit the coating is known from step 508, step 516 uses the wafer fabrication tool to deposit the coating on vertical surfaces of the photonic die. A common, but optional step 518 is discussed below. Step 520 measures horizontal coating thickness deposited simultaneously in step 516, to provide process feedback for the vertical thickness deposited, using the relationship characterized in step 508. Examples of steps 516 and 520 include depositing a coating on one or more photonic die, measuring thickness of a coating deposited on a horizontal surface of the photonic die, and using the relationship characterized in step 508 to indirectly determine the thickness of the coating on vertical surfaces of the photonic die. After step 508 is initially performed, it becomes an optional step; that is, once the relationship of horizontal coating thickness to vertical coating thickness is known, it need not be validated during each performance of method 500. However, based on results and ongoing engineering and quality control judgment, it would certainly be possible to repeat step 508 as often as deemed necessary.

Steps 502, 504, 506 and 518 are optional steps of method 500 that relate to use of a pocket wafer to present photonic die to a standard wafer fabrication tool for processing, as shown and discussed in connection with FIGS. 4 and 5 above. Steps 502, 504 and 506 would be performed as part of method 500, at least before step 516 and possibly before step 508. Step 518 would be performed as a mode of performing step 516. Optional step 502 provides a pocket wafer with recessed pockets for presenting photonic die to a standard wafer fabrication tool for processing. In some performances of method 500, the pocket wafer would already be available, and when not, optional step 504 would create the pocket wafer by forming one or more pockets in a wafer, each pocket having a depth sufficient to retain the intended photonic die. An example of step 504 include patterning and etching a wafer with an arrangement of pockets 410 therein, to form pocket wafer 400, as shown in FIG. 4. Care would be taken that a depth of each pocket is sufficient to retain the intended photonic die (e.g., through wafer loading and unloading cycles) as shown and discussed in connection with FIG. 5. Optional step 506 places photonic die for processing within one or more pockets of the pocket wafer. When a pocket wafer is to be used, it is not strictly necessary to perform step 506 before step 508, but it would usually be performed because use of a pocket wafer could affect the relationship of horizontal to vertical coating thicknesses characterized in step 508. When step 506 is performed, step 516 is performed as step 518, that is, once the photonic die are placed within the pocket wafer, that wafer and the photonic die would be used while the wafer fabrication deposits the coating.

The foregoing is provided for purposes of illustrating, explaining, and describing embodiments of the present invention. Upon reading and comprehending the present disclosure, one of ordinary skill in the art will readily conceive many equivalents, extensions, modifications, adaptations and alternatives. These equivalents, extensions, modifications, adaptations and alternatives may be made without departing from the scope or spirit of the invention. Different arrangements of the components depicted in the drawings or described above, as well as components and steps not shown or described, are possible. Similarly, some features and subcombinations are useful and may be employed without reference to other features and subcombinations.

The above description of exemplary embodiments of the invention has been presented for the purposes of illustration and description. It is not intended to be exhaustive or to limit the invention to the precise form described, and many modifications and variations are possible in light of the teaching above. Embodiments of the invention have been described for illustrative and not restrictive purposes, and alternative embodiments will become apparent to readers of this patent. The embodiments were chosen and described in order to explain the principles of the invention and practical applications thereof, to enable others skilled in the art to best utilize the invention in various embodiments and with various modifications as are suited to the particular use contemplated. Accordingly, the present invention is not limited to the embodiments described above or depicted in the drawings, and various embodiments and modifications can be made without departing from the scope of the claims below.

Appendix A of U.S. Provisional Patent Application No. 62/771,979, which is incorporated by reference in its entirety for all purposes, includes further material that illustrates non-limiting embodiments.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure.

A recitation of "a", "an", or "the" is intended to mean "one or more" unless specifically indicated to the contrary. All patents, patent applications, publications, and descriptions mentioned here are incorporated by reference in their entirety for all purposes. None is admitted to be prior art.

What is claimed is:

1. 1. A photonic die, comprising:
an optical component that is capable of emitting output light, the optical component comprising a substrate having a length and a width that are substantially greater than a thickness thereof, wherein a direction of the thickness defines a vertical direction, the optical component including a vertical edge through which the output light is emitted; and
a reflective or antireflective coating on the vertical edge, wherein the reflective or antireflective coating comprises a silicon-based material that includes $SiO_XN_Y$ having a refractive index n that is tuned within a range of n=1.85 to 1.90.

2. The photonic die of claim 1, wherein the reflective or antireflective coating consists exclusively of silicon-based materials.

3. The photonic die of claim 1, wherein the substrate is a compound semiconductor substrate and the optical component is an edge-emitting semiconductor laser.

4. The photonic die of claim 3, wherein:
the vertical edge is a first vertical edge;
the reflective or antireflective coating is a reflective coating forming a front mirror; and
the edge-emitting semiconductor laser forms a resonant cavity between the front mirror and a back mirror formed at a second vertical edge disposed across the resonant cavity from the first vertical edge.

5. The photonic die of claim 1, wherein the substrate is a silicon-based platform, and the photonic die further comprises one or more compound semiconductor gain chips integrated with the silicon-based platform.

6. The photonic die of claim 5, wherein at least one of the one or more compound semiconductor gain chips integrated with the silicon-based platform is in optical communication with the optical component, and wherein the optical communication is provided through a waveguide fabricated in the silicon-based platform.

7. The photonic die of claim 6, wherein the at least one of the one or more compound semiconductor gain chips is bonded within a recess in the silicon-based platform, the photonic die further comprising an optical bridge formed between the at least one of the one or more compound semiconductor gain chips and the waveguide.

8. The photonic die of claim 5, wherein at least one of the one or more compound semiconductor gain chips integrated with the silicon-based platform is a gain medium for a laser, or a gain medium for a modulator.

9. The photonic die of claim 5, wherein:
the silicon-based platform forms a V-groove adjacent to the vertical edge;
the V-groove facilitates alignment of an optical fiber to the vertical edge; and
the reflective or antireflective coating on the vertical edge is an antireflective coating that reduces reflections back to the photonic die when the output light transmits to the optical fiber.

10. A photonic die, comprising:
a silicon-based platform;
a plurality of semiconductor lasers integrated with the silicon-based platform, wherein each semiconductor laser of the plurality includes a respective gain chip within a respective optical cavity, and each semiconductor laser of the plurality provides output light at a different wavelength than others of the plurality of semiconductor lasers;
an echelle grating that combines the output lights of the plurality of semiconductor lasers into a single output waveguide that ends at a vertical output facet transverse to the output waveguide, wherein the output waveguide comprises silicon;
a V-groove in the silicon-based platform adjacent to the vertical output facet;
and an antireflective coating on the vertical output facet, wherein the antireflective coating is a single layer of $SiO_XN_Y$ having a refractive index n that is tuned within a range of n=1.85 to 1.90.

11. The photonic die of claim 10, wherein each of the respective optical cavities for each of the semiconductor lasers comprises a pair of distributed Bragg reflectors in optical communication with the respective gain chip.

12. The photonic die of claim 10, wherein the silicon-based platform is a silicon-on-insulator platform.

* * * * *